United States Patent
Kura et al.

(10) Patent No.: US 11,910,717 B2
(45) Date of Patent: Feb. 20, 2024

(54) PIEZOELECTRIC ACTUATOR

(71) Applicant: Brother Kogyo Kabushiki Kaisha, Aichi-Ken (JP)

(72) Inventors: Keiji Kura, Chita (JP); Takashi Aiba, Nagoya (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 559 days.

(21) Appl. No.: 17/177,645

(22) Filed: Feb. 17, 2021

(65) Prior Publication Data

US 2021/0305482 A1 Sep. 30, 2021

(30) Foreign Application Priority Data

Mar. 30, 2020 (JP) ................................ 2020-059487

(51) Int. Cl.
*H01L 41/047* (2006.01)
*H10N 30/50* (2023.01)
*H10N 30/87* (2023.01)
*H10N 30/20* (2023.01)

(52) U.S. Cl.
CPC ......... *H10N 30/50* (2023.02); *H10N 30/2047* (2023.02); *H10N 30/874* (2023.02)

(58) Field of Classification Search
CPC .. H10N 30/50; H10N 30/2047; H10N 30/874; H10N 30/87; H10N 30/875
USPC ................................................. 310/365, 366
See application file for complete search history.

(56) References Cited

U.S. PATENT DOCUMENTS

| 2004/0263582 | A1 | 12/2004 | Sugahara | |
|---|---|---|---|---|
| 2009/0219346 | A1 | 9/2009 | Suzuki | |
| 2010/0033520 | A1 | 2/2010 | Hibino | |
| 2011/0050809 | A1* | 3/2011 | Takahashi | B41J 2/14233 310/366 |
| 2013/0084199 | A1* | 4/2013 | Tanaka | B41J 2/14209 29/25.35 |

(Continued)

FOREIGN PATENT DOCUMENTS

| JP | 2004-202975 A | 7/2004 |
|---|---|---|
| JP | 2005-119289 A | 5/2005 |

(Continued)

OTHER PUBLICATIONS

Dec. 5, 2023—(JP) Notice of Reasons for Refusal—JP App 2020-059487, Eng Tran.

*Primary Examiner* — Derek J Rosenau
(74) *Attorney, Agent, or Firm* — Banner & Witcoff, Ltd.

(57) ABSTRACT

A piezoelectric actuator includes an electrode layer including a trunk portion and a plurality of branch portions branched from the trunk portion. The trunk portion includes a plurality of junction points from each of which a corresponding branch portion of the plurality of branch portions are branched, an end spaced from the plurality of junction points, and a second through hole positioned between the plurality of junction points and the end of the trunk portion. A plurality of first through holes are grouped into a first group and a second group. The first group overlaps, in a first direction, a particular area defined between the end of the trunk portion and the second through hole and the second group overlaps, in the first direction, another particular area defined between the second through hole and the plurality of junction points.

8 Claims, 10 Drawing Sheets

(56) References Cited

U.S. PATENT DOCUMENTS

2015/0102835 A1 4/2015 Huygens et al.
2019/0299616 A1 10/2019 Aiba et al.

FOREIGN PATENT DOCUMENTS

| JP | 2009-202508 A | 9/2009 |
| JP | 2010-36561 A | 2/2010 |
| JP | 2010-271175 A | 12/2010 |
| JP | 2011-54592 A | 3/2011 |
| JP | 2018-034474 A | 3/2018 |
| JP | 2019-171681 A | 10/2019 |
| JP | 2019-171682 A | 10/2019 |

* cited by examiner

PIEZOELECTRIC ACTUATOR

CROSS-REFERENCE TO RELATED APPLICATION

This application claims priority from Japanese Patent Application No. 2020-059487 filed on Mar. 30, 2020, the content of which is incorporated herein by reference in its entirety.

TECHNICAL FIELD

Aspects of the disclosure relate to a piezoelectric actuator including a plurality of piezoelectric layers and a plurality of electrode layers.

BACKGROUND

A known piezoelectric actuator includes a plurality of piezoelectric layers and a plurality of electrode layers including, for example, a drive electrode, a high potential electrode, and a low potential electrode. Each of the electrode layers is disposed on one of surfaces of a corresponding one of the piezoelectric layers.

SUMMARY

For fixing the piezoelectric actuator to another member, for example, a channel member, through holes defined in the electrode layers may be detected and used as a reference for positioning the piezoelectric actuator relative to the channel member. Nevertheless, the existence of the through holes in the electrode layers may cause increase of electric resistance in the piezoelectric actuator, thereby reducing the flow of current in the piezoelectric actuator.

Accordingly, aspects of the disclosure provide a piezoelectric actuator that may reduce increase of electric resistance in the piezoelectric actuator although having through holes in electrode layers.

In one or more aspects of the disclosure, a piezoelectric actuator may include a first piezoelectric layer, a first electrode layer, a second piezoelectric layer, and a second electrode. The first piezoelectric layer may have a plurality of first through holes. The first electrode layer may be disposed on one surface of the first piezoelectric layer. The first electrode layer may be connected to a power supply. The second piezoelectric layer may be disposed opposite to the first electrode layer with respect to the first piezoelectric layer in a first direction orthogonal to the surface of the first piezoelectric layer. The second electrode layer may be disposed between the first piezoelectric layer and the second piezoelectric layer in the first direction. The first electrode layer and the second electrode layer may be electrically connected to each other via the plurality of first through holes of the first piezoelectric layer. The second electrode layer may include a trunk portion and a plurality of branch portions branched from the trunk portion. The trunk portion may include a plurality of junction points, an end, and a second through hole. Each branch portion of the plurality of branch portions may be branched from a corresponding junction point of the plurality of junction points. The end of the trunk portion may be spaced from the plurality of junction points. The second through hole may be positioned between the plurality of junction points and the end of the trunk portion. The plurality of first through holes may be grouped into a first group and a second group. The first group may overlap, in the first direction, a particular area defined between the end of the trunk portion and the second through hole. The second group may overlap, in the first direction, another particular area defined between the second through hole and the plurality of junction points.

According to one or more aspects of the disclosure, the first electrode layer and the second electrode layer may be electrically connected to each other via not only the first through holes belonging to the first group but also the first through holes belonging to the second group. Even when the second through hole is defined in the second electrode layer, such a configuration may thus enable supply of electric charge to the second electrode layer via the first through holes belonging to the second group, thereby reducing or preventing increase of electric resistance in the second electrode layer.

DETAILED DESCRIPTION

In the following description, a Z-axis direction corresponds to a vertical direction, and an X-axis direction and a Y-axis direction each correspond to a horizontal direction. The X-axis direction and the Y-axis direction are both orthogonal to the Z-axis direction. The X-axis direction is orthogonal to the Y-axis direction. The Z-axis direction corresponds to a first direction. The X-axis direction corresponds to a third direction. The Y-axis direction corresponds to a second direction.

Overall Configuration of Printer

Figure 1:
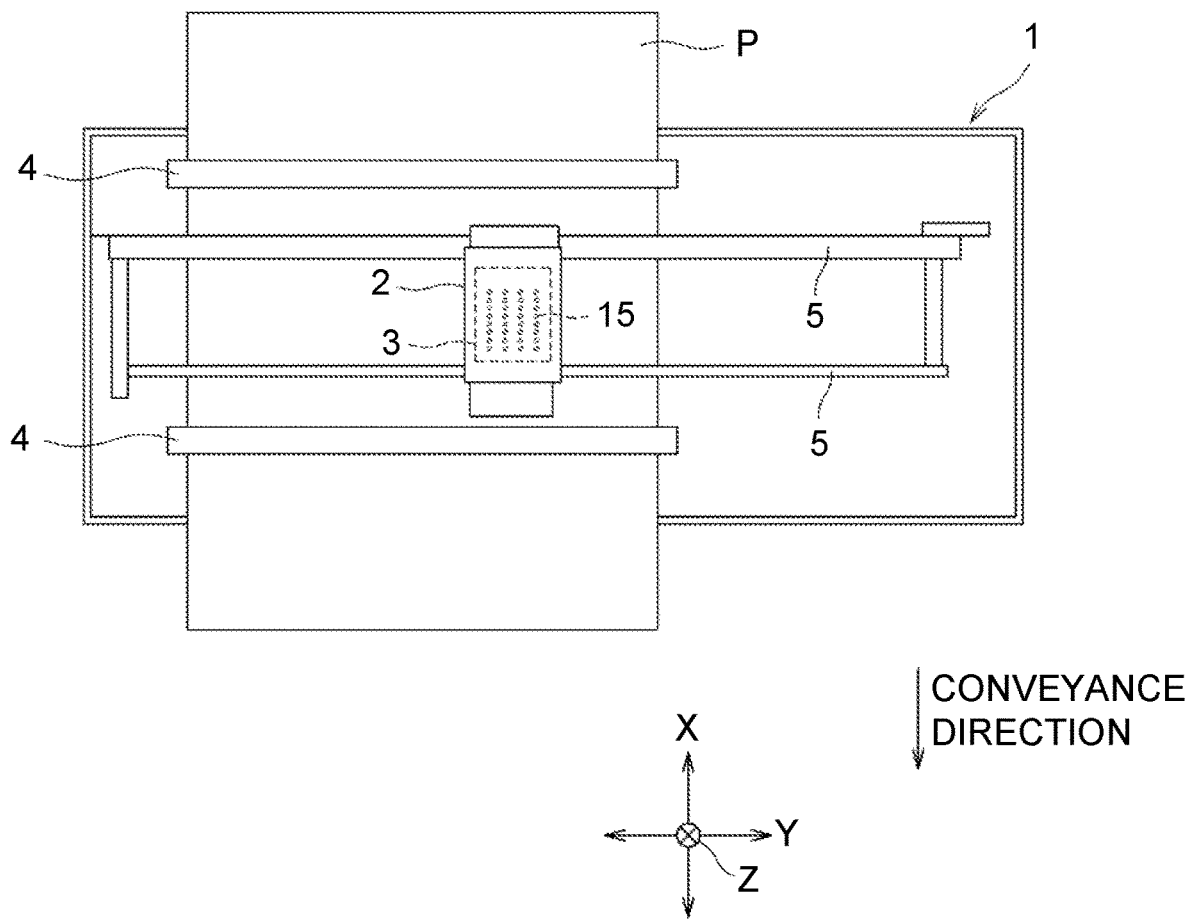
FIG. 1 illustrates an overall configuration of a printer including a piezoelectric actuator according to one or more illustrative embodiments of the disclosure.

Referring to FIG. 1, a description will be provided on an overall configuration of a printer 1 including a piezoelectric actuator according to one or more illustrative embodiments of the disclosure.

The printer 1 includes a head 3, a carriage 2, and two conveyance roller pairs 4.

The carriage 2 is supported by two guide rails 5 extending in the Y-axis direction. The carriage 2 is configured to reciprocate in the Y-axis direction along the guide rails 5.

The head 3 may be a serial head. The head 3 is mounted on the carriage 2 and is movable in the Y-axis direction together with the carriage 2. The head 3 has a plurality of nozzles 15 defined in its lower surface facing downward in the Z-axis direction.

The conveyance roller pairs 4 are disposed on opposite sides of the carriage 2 in the X-axis direction. In response to the conveyance roller pairs 4 rotating with at least one of the conveyance roller pairs 4 pinching a sheet P between its rollers, the sheet P is conveyed in a conveyance direction parallel to the X-axis direction.

The printer 1 includes a controller. The controller causes the printer 1 to alternately perform an ejecting operation and a conveying operation. In the ejecting operation, the controller causes the head 3 to eject ink from one or more of the nozzles 15 while moving the head 3 together with the carriage 2 in the Y-axis direction. In the conveying operation, the controller causes the conveyance roller pairs 4 to convey a sheet P by a certain distance in the conveyance direction. Such a control may thus enable recording of an image onto the sheet P.

Configuration of Head

Figure 2:
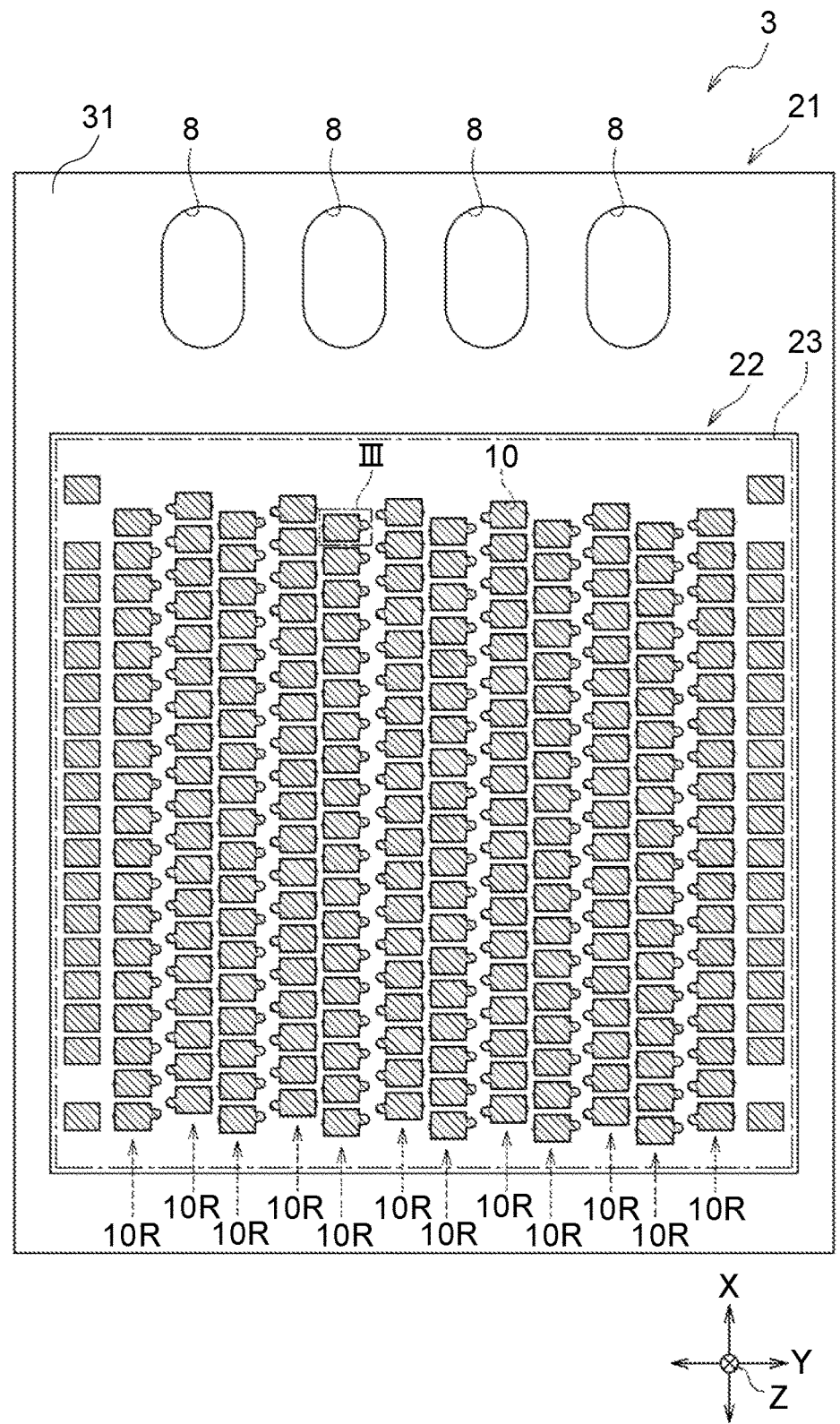
FIG. 2 is a plan view of a head of the printer of FIG. 1 including the piezoelectric actuator according to one or more illustrative embodiments of the disclosure.

As illustrated in FIG. 2, the head 3 includes a channel unit 21, a piezoelectric actuator 22, and a chip on film ("COF") 23. The piezoelectric actuator 22 is disposed on an upper surface of the channel unit 21. The COF 23 is elongated in the X-axis direction. A middle portion of the COF 23 in the X-axis direction is fixed to an upper surface of the piezoelectric actuator 22. The COF 23 has end portions in the X-axis direction. The end portions of the COF 23 extend to above the head 3 and are connected to the controller of the printer 1.

Configuration of Channel Unit

Figure 4:
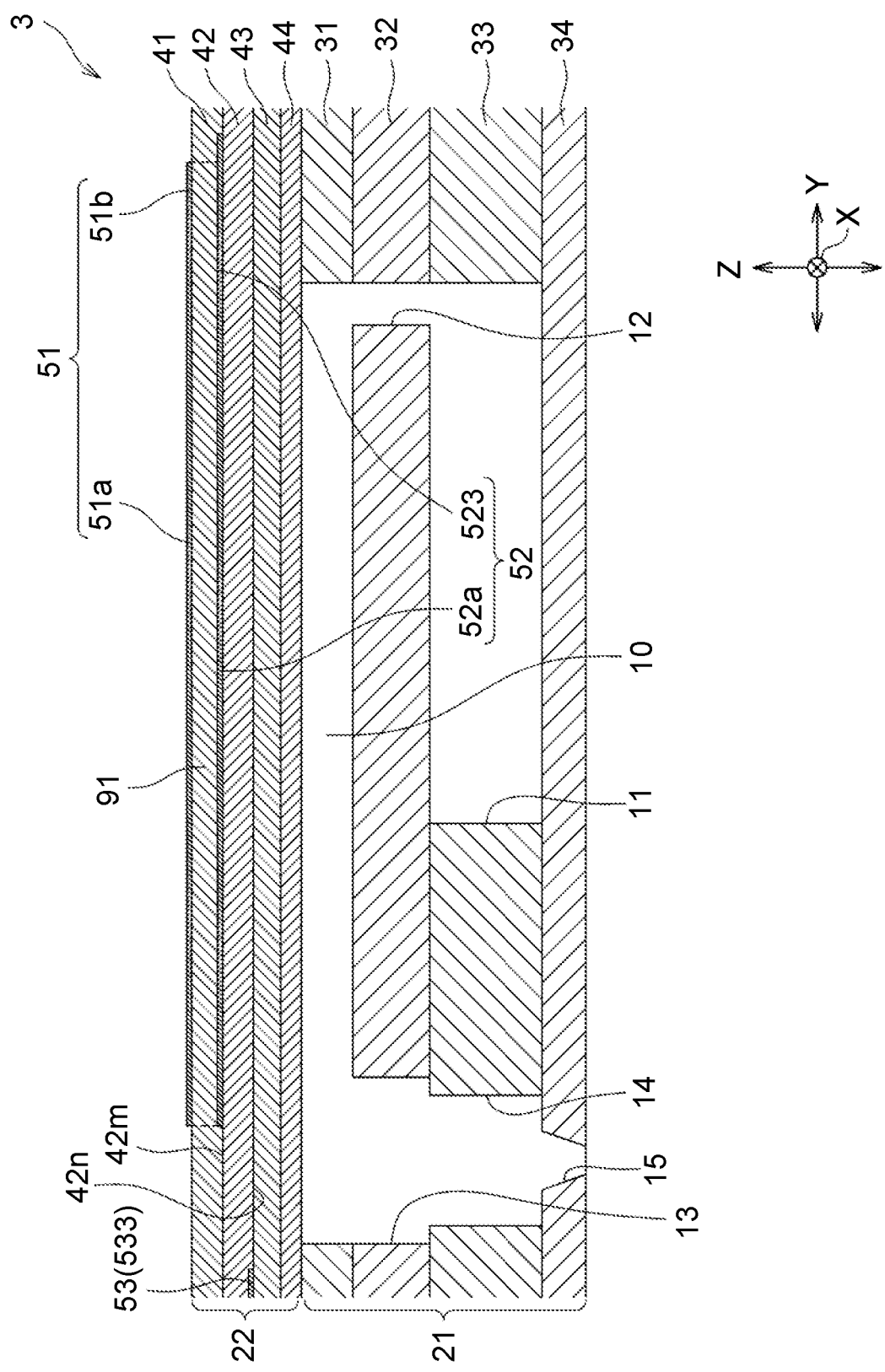
FIG. 4 is a sectional view taken along line IV-IV of FIG. 3 according to one or more illustrative embodiments of the disclosure.

As illustrated in FIG. 4, the channel unit 21 includes a plurality of plates, for example four plates 31, 32, 33, and 34, stacked one above another in the Z-axis direction.

The plate 31 has a plurality of pressure chambers 10. The plate 32 has a plurality of communication channels 12 and a plurality of communication channels 13. One each of the communication channels 12 and 13 are provided for each pressure chamber 10. Each pressure chamber 10 has one end and another end in the Y-axis direction. Each communication channel 12 overlaps one end of a corresponding pressure chamber 10 in the Z-axis direction. Each communication channel 13 overlaps the other end of a corresponding pressure chamber 10 in the Z-axis direction. The plate 33 has communication channels 14 for the respective communication channels 13. Each communication channel 14 overlaps a corresponding communication channel 13 in the Z-axis direction. The plate 33 further has a plurality of manifold channels 11, for example twelve manifold channels 11. The pressure chambers 10 are arranged in a plurality of rows 10R (refer to FIG. 2). In each row 10R, the pressure chambers 10 are aligned in the X-axis direction. The manifold channels 11 are provided for the respective rows 10R. Each manifold channel 11 extends in the X-axis direction and is in communication with the pressure chambers 10 belonging to a corresponding row 10R via the respective corresponding communication channels 12. The plate 34 has the nozzles 15 defined therein. Each nozzle 15 overlaps a corresponding communication channel 14 in the Z-axis direction.

The plate 31 further has a plurality of ink inlets 8, for example four ink inlets 8, in an area where the piezoelectric actuator 22 is not disposed (refer to FIG. 2). Each ink inlet 8 is in communication with a corresponding ink cartridge and three corresponding manifold channels 11. Ink is supplied from an ink cartridge to the head 3 via an ink inlet 8 flows into three corresponding manifold channels 11. Ink further flows from the manifold channels 11 via the communication channels 12 to the pressure chambers 10 belonging to the rows 10R corresponding to the three manifold channels 11. In response to the piezoelectric actuator 22 being driven, pressure is applied to ink in the pressure chambers 10. Thus, ink flows from the pressure chambers 10 to the respective nozzles 15 via the corresponding communication channels 13 and 14 and the head 3 ejects ink through the nozzles 15.

Configuration of Piezoelectric Actuator

As illustrated in FIG. 4, the piezoelectric actuator 22 includes three piezoelectric layers 41, 42 and 43, an ink separation layer 44, a plurality of drive electrodes 51, a high potential electrode 52, and a low potential electrode 53. The piezoelectric layers 41, 42 and 43 and the ink separation layer 44 are stacked one above another in the Z-axis direction.

The ink separation layer 44 is disposed on an upper surface of the plate 31 and covers all the pressure chambers 10 defined in the plate 31. The ink separation layer 44 includes, for example, a metal material such as stainless steel, a piezoelectric material containing lead zirconate titanate as a main component, or a synthetic resin material.

The piezoelectric layer 43 is disposed on an upper surface of the ink separation layer 44. The piezoelectric layer 42 is disposed on an upper surface of the piezoelectric layer 43. The piezoelectric layer 41 is disposed on an upper surface of the piezoelectric layer 42. The piezoelectric layers 41, 42, and 43 each include, for example, a piezoelectric material containing lead zirconate titanate as a main component.

Figure 3:
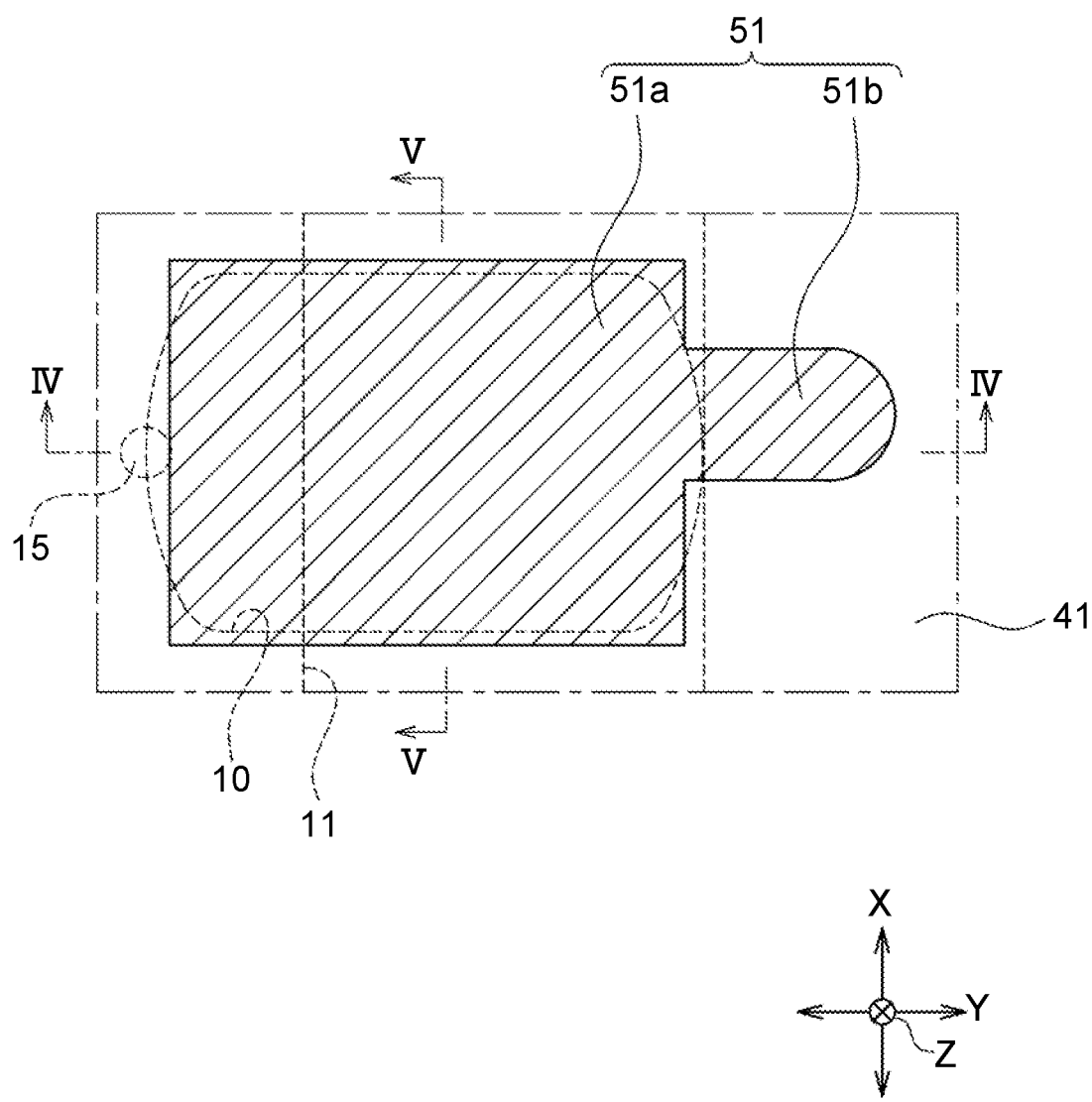
FIG. 3 is an enlarged view of a particular portion III of the head of FIG. 2 according to one or more illustrative embodiments of the disclosure.

As illustrated in FIG. 3, the drive electrodes 51 are disposed on an upper surface of the piezoelectric layer 41 and each is in one-to-one correspondence with a corresponding pressure chamber 10. Each drive electrode 51 has a main portion 51a and a projecting portion 51b. The main portion 51a overlaps substantially the entirety of a corresponding pressure chamber 10 in the Z-axis direction. The projecting portion 51b protrudes from the main portion 51a in the Y-axis direction and does not overlap any pressure chamber 10 in the Z-axis direction. The projecting portion 51b has a contact electrically connected to wiring of the COF 23. The COF 23 includes a driver IC mounted thereon. The controller controls the driver IC to apply either a high potential (e.g., a VDD potential) or a low potential (e.g., a GND potential) to the respective drive electrodes 51 individually via the wiring of the COF 23.

Figure 7:
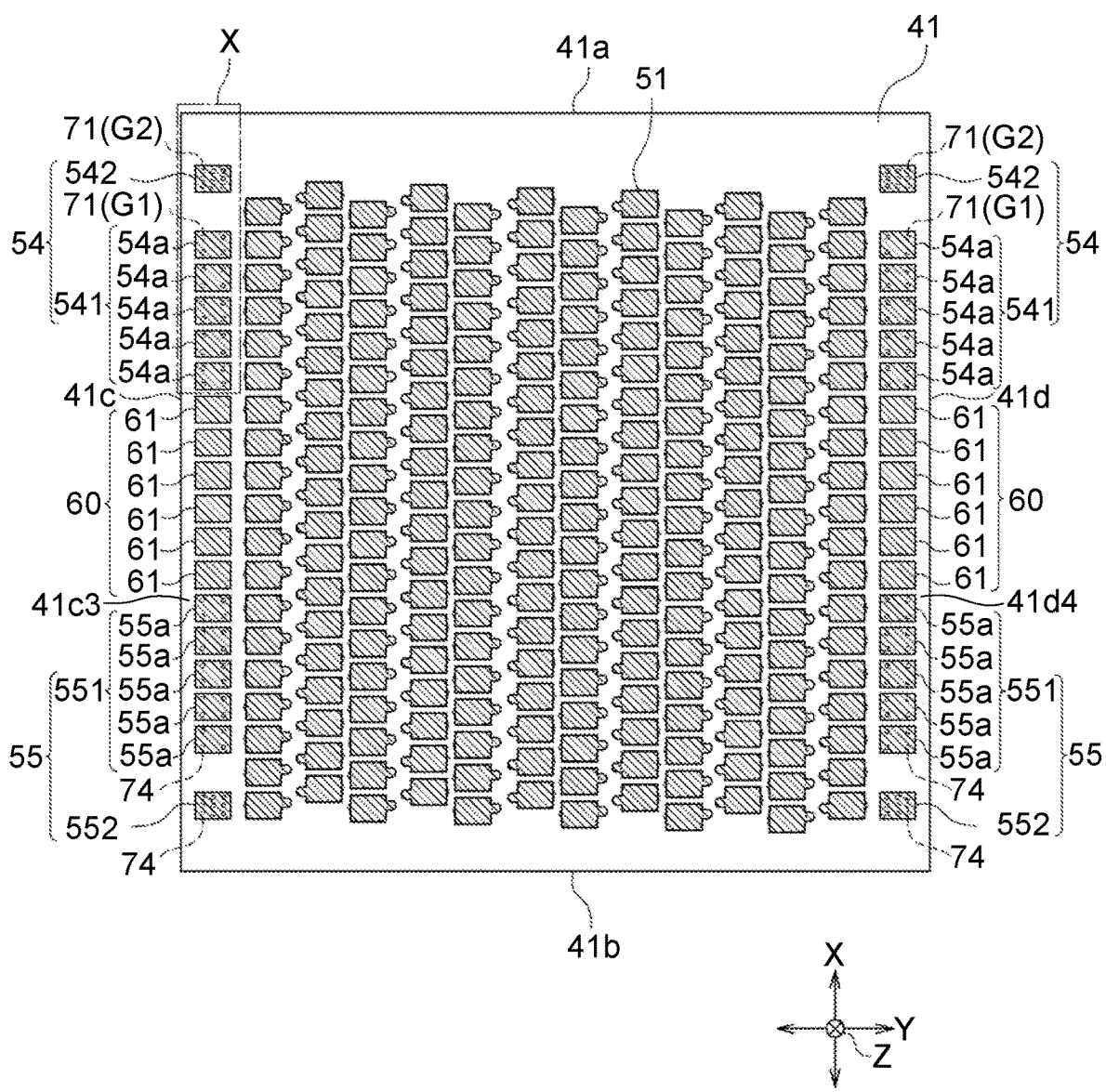
FIG. 7 is a plan view of the piezoelectric actuator of FIG. 2 illustrating an upper surface of an uppermost piezoelectric layer among three piezoelectric layers included in the piezoelectric actuator.

As shown in FIG. 7, two high-potential terminal groups 54, two low-potential terminal groups 55, and two electrode groups 60 are disposed on the upper surface of the piezoelectric layer 41 in addition to the drive electrodes 51.

The piezoelectric layer 41 has a first end 41a and a second end 41b opposite to each other in the X-axis direction and a third end 41c and a fourth end 41d opposite to each other in the Y-axis direction. The piezoelectric layer 41 includes a third end portion 41c3 corresponding to the third end 41c and a fourth end portion 41d4 corresponding to the fourth end 41d. One each of the high-potential terminal groups 54, the low-potential terminal groups 55, and the electrode groups 60 are disposed on the third end portion 41c3 and the fourth end portion 41d4, respectively, of the piezoelectric layer 41. The high-potential terminal groups 54, the low-potential terminal groups 55, and the electrode groups 60 are symmetrically placed with respect to a straight line extending along the X-axis direction through the center of the piezoelectric layer 41 in the Y-axis direction. More specifically, for example, at the third end portion 41c3 of the piezoelectric layer 41, the high-potential terminal group 54, the low-potential terminal group 55, and the electrode group 60 are arranged next to each other in the X-axis direction. At the fourth end portion 41d4 of the piezoelectric layer 41, the high-potential terminal group 54, the low-potential terminal group 55, and the electrode group 60 are arranged next to each other in the X-axis direction.

Each high-potential terminal group 54 includes an electrode portion 541 and an electrode portion 542. The electrode portion 541 includes a plurality of electrodes 54a. The electrode portion 542 includes a single electrode. The electrode portion 542 is disposed between the first end 41a of the piezoelectric layer 41 and the electrode portion 541 in the X-axis direction. The electrodes 54a included in the electrode portion 541 are equally spaced in the X-axis direction. The electrode portion 541 and the electrode portion 542 are spaced from each other in the X-axis direction. A gap between the electrode portion 541 and the electrode portion 542 in the X-axis direction is greater than an interval between the electrodes 54a included in the electrode portion 541. The electrode portion 542 has an area smaller than an area of the electrode portion 541 including the electrodes 54a.

Each low-potential terminal group 55 includes an electrode portion 551 and an electrode portion 552. The electrode portion 551 includes a plurality of electrodes 55a. The electrode portion 552 includes a single electrode. The electrode portion 552 is disposed between the second end 41b of the piezoelectric layer 41 and the electrode portion 551 in the X-axis direction. The electrodes 55a included in the electrode portion 551 are equally spaced in the X-axis direction. The electrode portion 551 and the electrode portion 552 are spaced from each other in the X-axis direction. A gap between the electrode portion 551 and the electrode portion 552 in the X-axis direction is greater than an interval between the electrodes 55a included in the electrode portion 551. The electrode portion 552 has an area smaller than an area of the electrode portion 551 including the electrodes 55a.

At each of the third end portion 41c3 and the fourth end portion 41d4, the high-potential terminal group 54 and the low-potential terminal group 55 are disposed on opposite sides of the electrode group 60 in the X-axis direction. The high-potential terminal group 54 and the low-potential terminal group 55 are symmetrically placed with respect to a straight line extending along the Y-axis direction through the center of the piezoelectric layer 41 in the X-axis direction.

Each electrode group 60 includes electrodes 61 equally spaced in the X-axis direction.

The high-potential terminal groups 54 and the low-potential terminal groups 55 are electrically connected to the wiring of the COF 23. The controller causes the driver IC to apply, via the wiring of the COF 23, a high potential (e.g., a VDD potential) to each electrode 54a of the high-potential terminal groups 54 and a low potential (e.g., a GND potential) to each electrode 55a of the low-potential terminal groups 55.

The electrode groups 60 are not electrically connected to the wiring of the COF 23. The driver IC is thus not allowed to apply charge to the electrodes 61 of the electrode groups 60.

Figure 8:
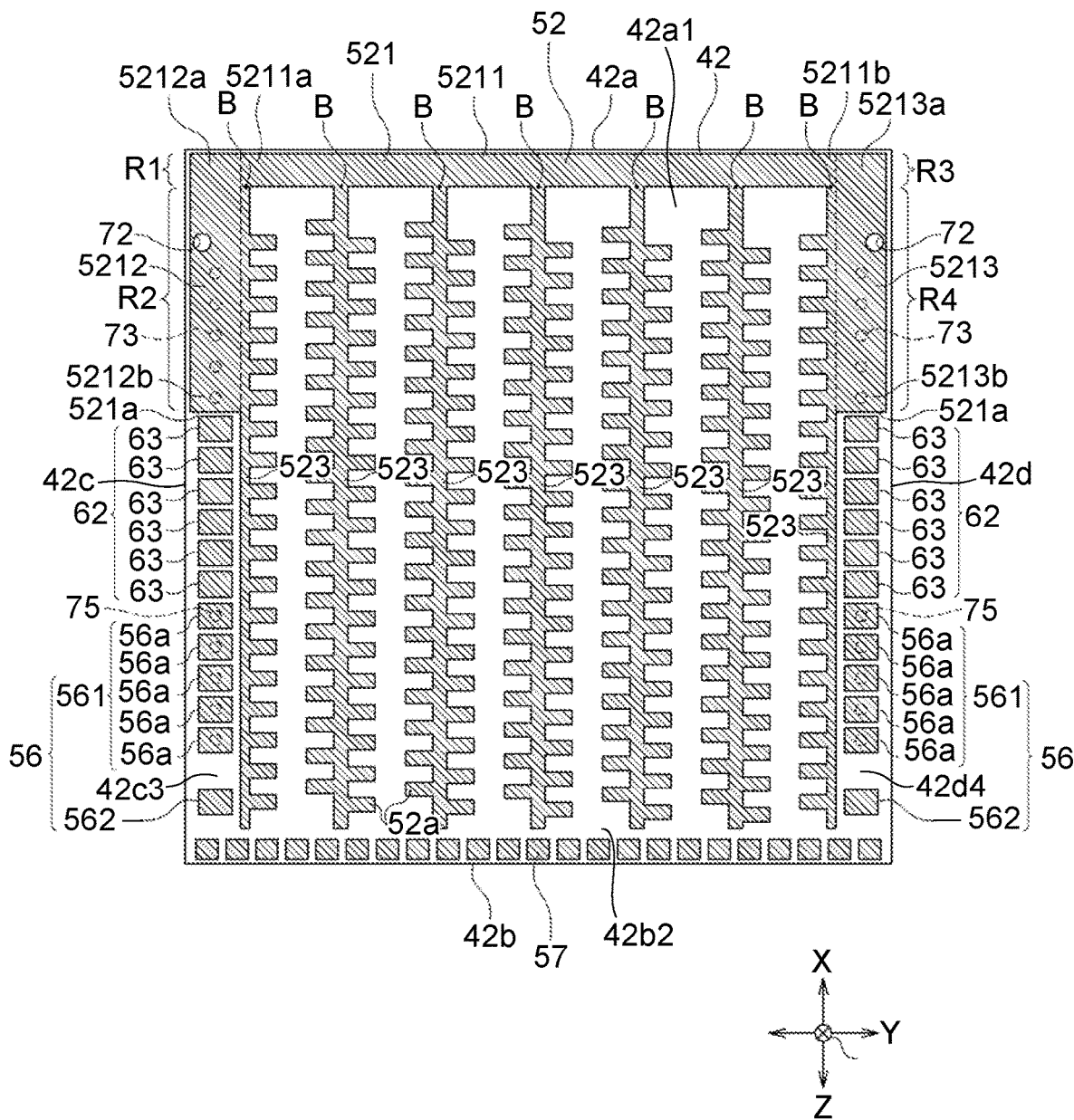
FIG. 8 is a plan view of the piezoelectric actuator of FIG. 2 illustrating an upper surface of a middle piezoelectric layer among the three piezoelectric layers included in the piezoelectric actuator.

As illustrated in FIG. 8, the high potential electrode 52 is disposed on the upper surface of the piezoelectric layer 42. The high potential electrode 52 includes a single trunk portion 521, a plurality of branch portions 523, and a plurality of individual portions 52a. The branch portions 523 are branched from the trunk portion 521. The individual portions 52a are arranged in the X-axis direction and connected to each other by the branch portions 523. Each individual portion 52a overlaps, in the Z-axis direction, a middle portion of a corresponding pressure chamber 10 in the X-axis direction (refer to FIG. 5).

The trunk portion 521 includes an elongated portion 5211 extending in the Y-axis direction and elongated portions 5212 and 5213 extending in the X-axis direction. The elongated portion 5212 has one end portion 5212a and another end portion 5212b in the X-axis direction. The elongated portion 5213 has one end portion 5213a and another end portion 5213b in the X-axis direction. The one end portion 5212a of the elongated portion 5212 and the one end portion 5213a of the elongated portion 5213 are connected to the elongated portion 5211.

The piezoelectric layer 42 has a fifth end 42a and a sixth end 42b opposite to each other in the X-axis direction and a seventh end 42c and an eighth end 42d opposite to each other in the Y-axis direction. The piezoelectric layer 42 includes a fifth end portion 42a1 corresponding to the fifth end 42a, a sixth end portion 42b2 corresponding to the sixth end 42b, a seventh end portion 42c3 corresponding to the seventh end 42c, and an eighth end portion 42d4 corresponding to the eighth end 42d. The elongated portion 5211 extends in the Y-axis direction at the fifth end portion 42a1 of the piezoelectric layer 42. The elongated portion 5211 is provided with the branch portions 523. Each branch portion 523 extends along the X-axis direction from the elongated portion 5211 toward the sixth end 42b of the piezoelectric layer 42.

The elongated portion 5212 extends in the X-axis direction from the fifth end 42a of the piezoelectric layer 42 toward the middle between the fifth end 42a and the sixth end 42b at the seventh end portion 42c3 of the piezoelectric layer 42. The elongated portion 5212 is connected to one end 5211a of the elongated portion 5211 in the Y-axis direction and the branch portion 523 that is closest to the seventh end 42c of the piezoelectric layer 42 in the Y-axis direction among the plurality of branch portions 523.

The elongated portion 5213 extends in the X-axis direction from the fifth end 42a of the piezoelectric layer 42 toward the middle between the fifth end 42a and the sixth end 42b at the eighth end portion 42d4 of the piezoelectric layer 42. The elongated portion 5213 is connected to the other end 5211b of the elongated portion 5211 in the Y-axis direction and the branch portion 523 that is closest to the eighth end 42d of the piezoelectric layer 42 in the Y-axis direction among the plurality of branch portions 523.

The piezoelectric layer 41 has through holes 71 (refer to FIG. 7). The elongated portions 5212 and 5213 of the piezoelectric layer 42 are electrically connected to the respective corresponding high-potential terminal groups 54 via the corresponding through holes 71. Thus, the high potential electrode 52 including the elongated portions 5212 and 5213 are electrically connected to the high-potential terminal groups 54.

As shown in FIG. 8, two connection electrode groups 56, two electrode groups 62, and a plurality of electrodes 57 are disposed on the upper surface of the piezoelectric layer 42 in addition to the high potential electrode 52.

One each of the connection electrode groups 56 and the electrode groups 62 are disposed on the seventh end portion 42c3 and the eighth end portion 42d4, respectively, of the piezoelectric layer 42. The connection electrode groups 56 and the electrode groups 62 are symmetrically placed with respect to a straight line extending along the X-axis direction through the center of the piezoelectric layer 42 in the Y-axis direction. More specifically, for example, at the seventh end portion 42c3 of the piezoelectric layer 42, the connection electrode group 56 and the electrode group 62 are arranged next to each other in the X-axis direction. At the eighth end portion 42d4 of the piezoelectric layer 42, the connection electrode group 56 and the electrode group 62 are arranged next to each other in the X-axis direction.

Each connection electrode group 56 includes an electrode portion 561 and an electrode portion 562. The electrode portion 561 includes a plurality of electrodes 56a. The electrode portion 562 includes a single electrode. The electrode portion 562 is disposed between the sixth end 42b of the piezoelectric layer 42 and the electrode portion 561 in the X-axis direction. The electrodes 56a included in the electrode portion 561 are equally spaced in the X-axis direction. The electrode portion 561 and the electrode portion 562 are spaced from each other in the X-axis direction. A gap between the electrode portion 561 and the electrode portion 562 in the X-axis direction is greater than an interval between the electrodes 56a included in the electrode portion 561. The electrode portion 562 has an area smaller than an area of the electrode portion 561 including the electrodes 56a.

Each electrode group 62 includes electrodes 63 equally spaced in the X-axis direction.

The electrodes 57 are aligned in the Y-axis direction at the sixth end portion 42b2 of the piezoelectric layer 42.

The piezoelectric layer 41 has through holes 74 (refer to FIG. 7). The connection electrode groups 56 are electrically connected to the respective corresponding low-potential terminal groups 55 via the corresponding through holes 74.

The electrode groups 62 and the electrodes 57 are not electrically connected to the high-potential terminal groups 54 or the low-potential terminal groups 55. The driver IC is thus not allowed to apply charge to the electrode groups 62 and the electrodes 57.

Figure 9:
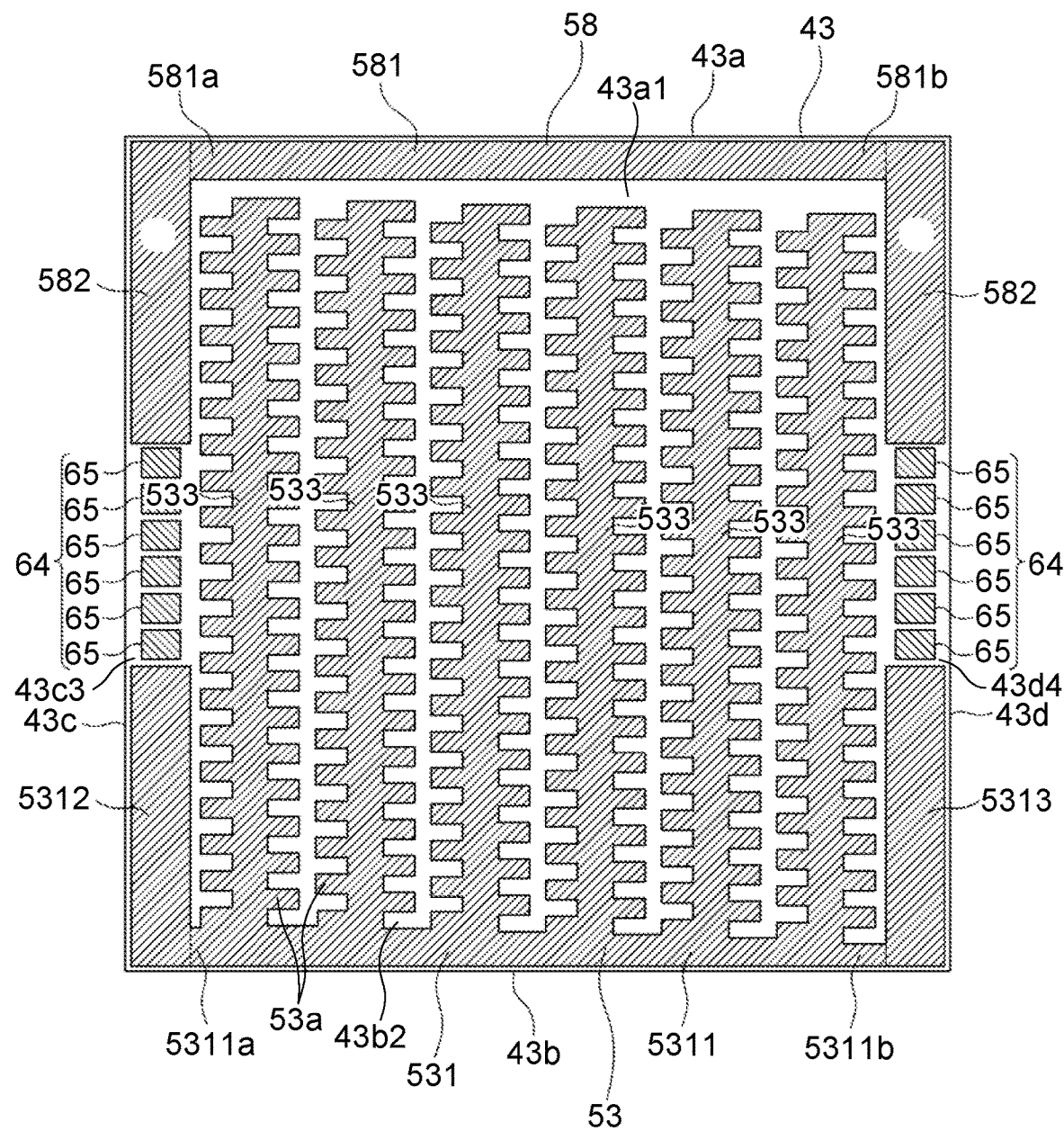
FIG. 9 is a plan view of the piezoelectric actuator of FIG. 2 illustrating an upper surface of a lowermost piezoelectric layer among the three piezoelectric layers included in the piezoelectric actuator.
Figure 9:
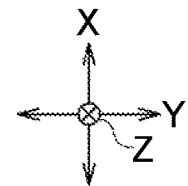

As illustrated in FIG. 9, the low potential electrode 53 is disposed on the upper surface of the piezoelectric layer 43. The low potential electrode 53 includes a single trunk portion 531, a plurality of branch portions 533, and a plurality of individual portions 53a. The branch portions 533 are branched from the trunk portion 531. The individual portions 53a are arranged in the X-axis direction and connected to each other by the branch portions 533. Among the individual portions 53a arranged in the X-axis direction, except for the endmost individual portions 53a in the X-axis direction, each individual portion 53a extends over adjacent two of the pressure chambers 10 in the X-axis direction. In each individual portion 53a, its end portions in the X-axis direction overlap the adjacent two pressure chambers 10 in the Z-axis direction (refer to FIG. 5). Each of the endmost individual portions 53a in the X-axis direction overlaps a corresponding one of the pressure chambers 10 in the Z-axis direction. That is, an individual portion 53a occupies an area in which the individual portion 53a overlaps, in the Z-axis direction, one end of a corresponding pressure chamber 10 and the other end of another corresponding pressure chamber 10 of adjacent two pressure chambers 10 in the X-axis direction and a portion of the upper surface of the piezoelectric layer 42 between the adjacent two pressure chambers 10 in the X-axis direction.

The trunk portion 531 includes an elongated portion 5311 extending in the Y-axis direction and elongated portions 5312 and 5313 extending in the X-axis direction.

The piezoelectric layer 43 has a ninth end 43a and a tenth end 43b opposite to each other in the X-axis direction and an eleventh end 43c and a twelfth end 43d opposite to each other in the Y-axis direction. The piezoelectric layer 43 includes a ninth end portion 43a1 corresponding to the ninth end 43a, a tenth end portion 43b2 corresponding to the tenth end 43b, an eleventh end portion 43c3 corresponding to the eleventh end 43c, and a twelfth end portion 43d4 corresponding to the twelfth end 43d. The elongated portion 5311 extends in the Y-axis direction at the tenth end portion 43b2 of the piezoelectric layer 43. The elongated portion 5311 is provided with the branch portions 533. Each branch portion 533 extends along the X-axis direction from the elongated portion 5311 toward the ninth end 43a of the piezoelectric layer 43.

The elongated portion 5312 extends from the tenth end 43b toward the middle between the tenth end 43b and the ninth end 43a along the X-axis direction at the eleventh end portion 43c3 of the piezoelectric layer 43. The elongated portion 5312 is connected to an end of one end portion 5311a of the elongated portion 5311 in the Y-axis direction.

The elongated portion 5313 extends from the tenth end 43b toward the middle between the tenth end 43b and the ninth end 43a along the X-axis direction at the twelfth end portion 43d4 of the piezoelectric layer 43. The elongated portion 5313 is connected to an end of the other end portion 5311b of the elongated portion 5311 in the Y-axis direction.

The piezoelectric layer 42 has through holes 75 (refer to FIG. 8). The elongated portions 5312 and 5313 are electrically connected to the respective corresponding connection electrode groups 56 via the corresponding through holes 75. The connection electrode groups 56 are electrically connected to the respective corresponding low-potential terminal groups 55 via the corresponding through holes 74 (refer to FIG. 7) of the piezoelectric layer 41. Thus, the low potential electrode 53 including the elongated portions 5312 and 5313 are electrically connected to the low-potential terminal groups 55.

As shown in FIG. 9, a connection electrode 58 and two electrode groups 64 are disposed on the upper surface of the piezoelectric layer 43 in addition to the low potential electrode 53.

The connection electrode 58 includes an elongated portion 581 and two elongated portions 582. The elongated portion 581 extends in the Y-axis direction at the ninth end portion 43a1 of the piezoelectric layer 43. The elongated portion 581 has one end portion 581a and another end portion 581b in the Y-axis direction. The elongated portions 582 extend in the X-axis direction. The elongated portions 582 are connected to an end of the one end portion 581a and an end of the other end portion 581b, respectively, of the elongated portion 581.

The electrode groups 64 are disposed at the eleventh end portion 43c3 and the twelfth end portion 43d4, respectively, of the piezoelectric layer 43. At the eleventh end portion 43c3, the electrode group 64 is disposed between the elongated portion 5312 of the low potential electrode 53 and the elongated portion 582 of the connection electrode 58 in the X-axis direction. At the twelfth end portion 43d4, the electrode group 64 is disposed between the elongated portion 5313 of the low potential electrode 53 and the elongated portion 582 of the connection electrode 58 in the X-axis direction. Each electrode group 64 includes electrodes 65 equally spaced in the X-axis direction.

The piezoelectric layer 42 has through holes 73 (refer to FIG. 8). The elongated portions 582 are electrically connected to the respective corresponding elongated portions 5212 and 5213 of the high potential electrode 52 via the corresponding through holes 73 of the piezoelectric layer 42. The elongated portions 5212 and 5213 are electrically connected to the respective corresponding high-potential terminal groups 54 via the corresponding through holes 71 (refer to FIG. 7) of the piezoelectric layer 41. Thus, the connection electrode 58 including the elongated portions 582 are electrically connected to the high-potential terminal groups 54.

As described above, the connection electrode 58 electrically connected to the high potential electrode 52 is disposed below the high potential electrode 52. Such a configuration may thus increase the number of routes for distributing, to the high potential electrode 52, charge applied to the high-potential terminal groups 54 by the driver IC, thereby improving electrical reliability.

The electrode groups 64 are not electrically connected to the wiring of the COF 23. The driver IC is thus not allowed to apply charge to the electrodes 65 of the electrode groups 64.

Actuator Portions

Figure 5:
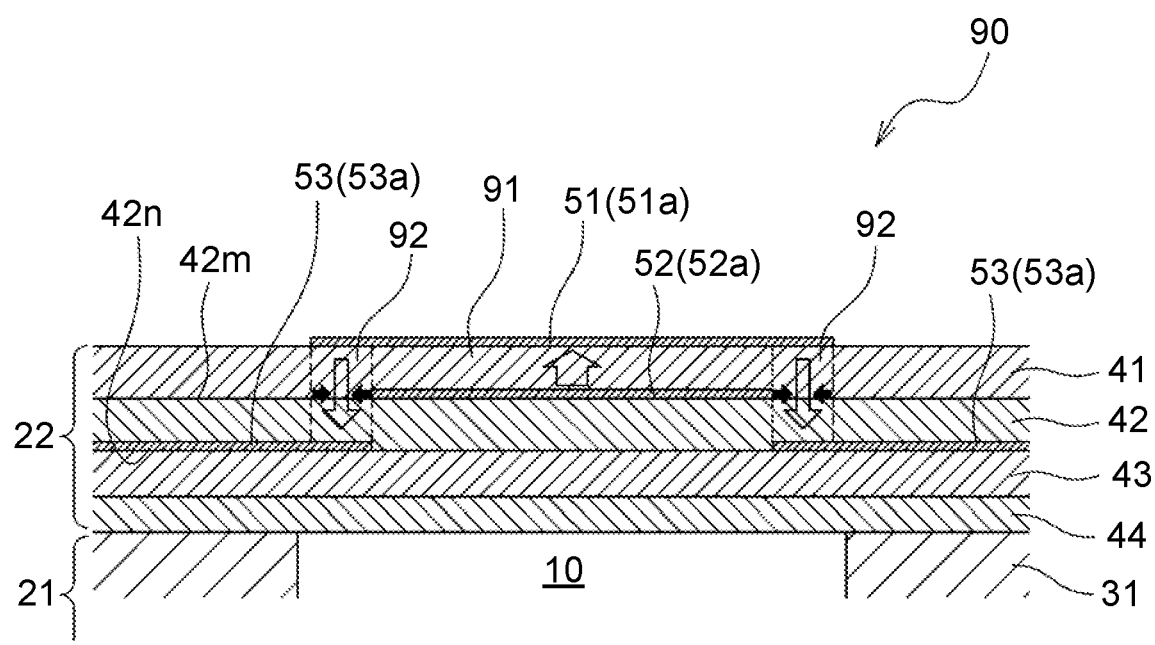
FIG. 5 is a sectional view taken along line V-V of FIG. 3 according to one or more illustrative embodiments of the disclosure.

As illustrated in FIG. 5, the piezoelectric actuator 22 includes an actuator portion 90 for each pressure chamber 10. Each actuator portion 90 includes a single first active portion 91 and two second active portions 92. In each actuator portion 90, a first active portion 91 is disposed between second active portions 92 in the X-axis direction. A first active portion 91 corresponds to a portion of the piezoelectric layer 41 sandwiched between a drive electrode 51 and an individual portion 52a of the high potential electrode 52 in the Z-axis direction. A second active portion 92 corresponds to a particular overlapping portion of the piezoelectric layers 42 and 43 sandwiched between a drive electrode 51 and an individual portion 53a of the low potential electrode 53 in the Z-axis direction. A first active portion 91 is polarized mainly upward. A second active portion 92 is polarized mainly downward.

Hereinafter, referring to FIGS. 6A and 6B, a description will be provided on how an actuator portion 90 behaves when ink is ejected from the head 3 through a corresponding nozzle 15.

Figure 6A:
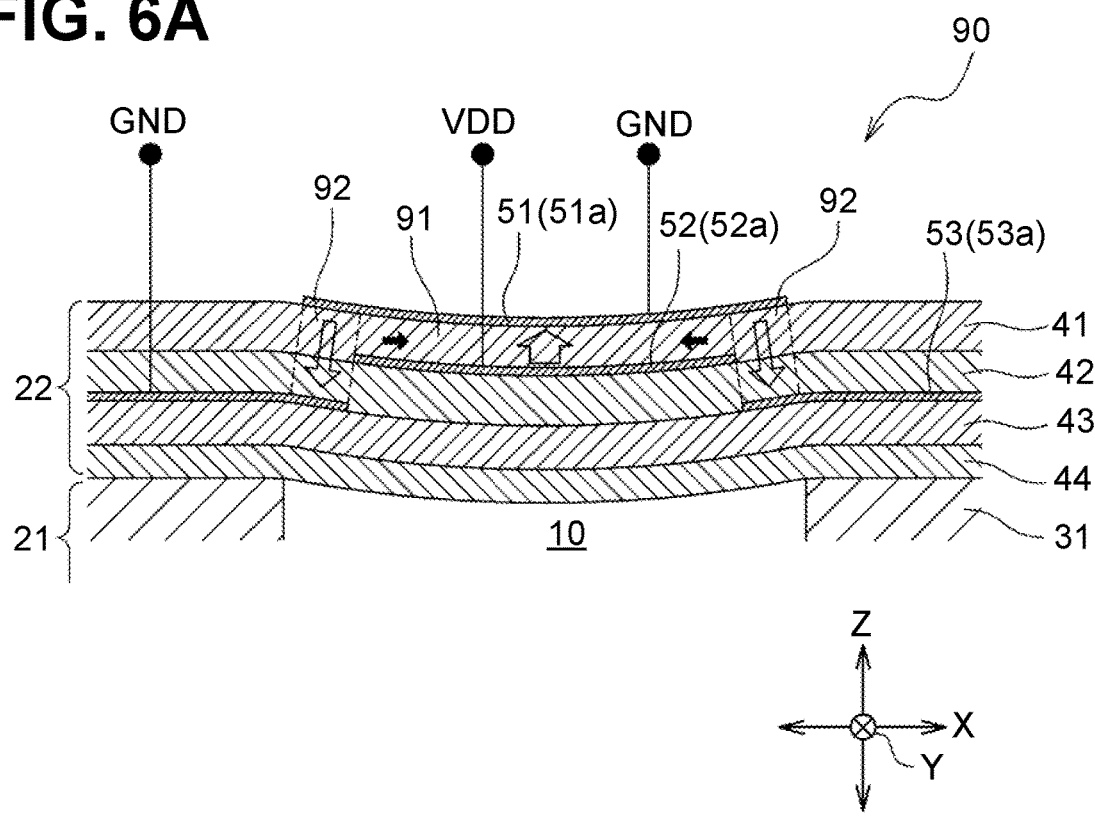
FIGS. 6A and 6B are sectional views of FIG. 5 each illustrating how an actuator portion behaves according to one or more illustrative embodiments of the disclosure.
Figure 6B:
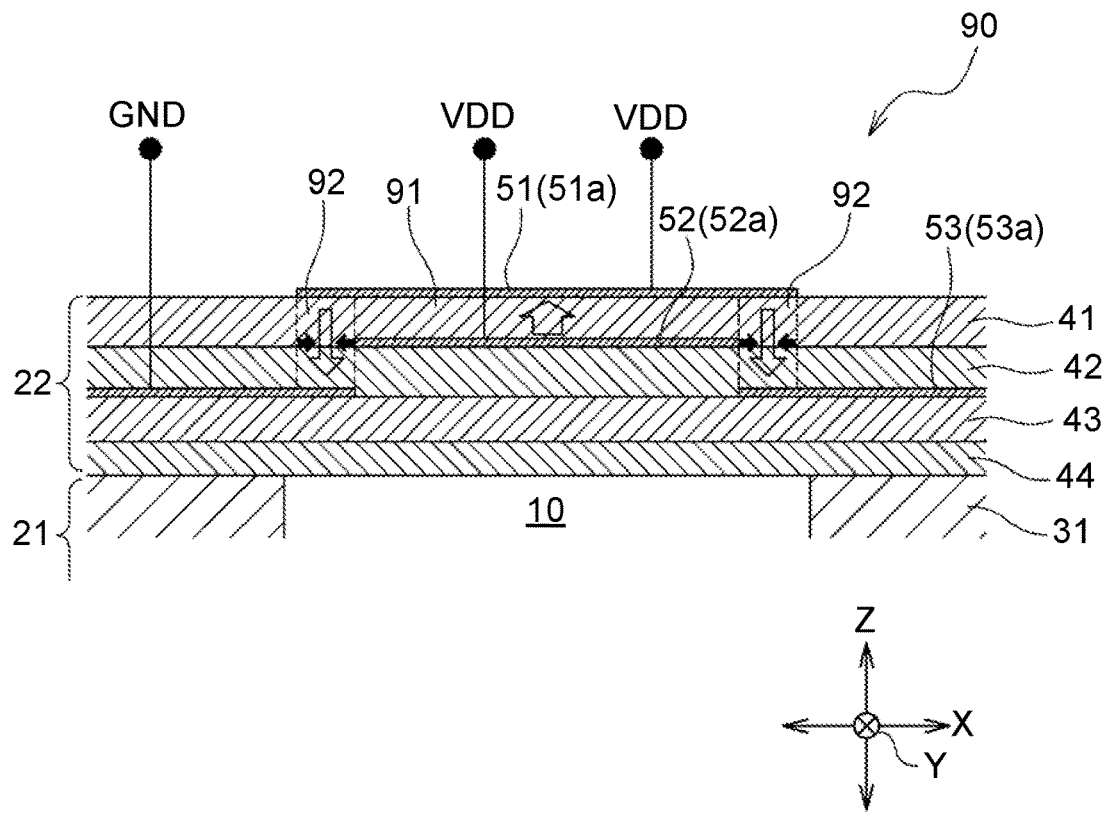

Before the printer 1 starts a recording operation, as illustrated in FIG. 6A, a low potential (e.g., the GND potential) is applied to each drive electrode 51. At that time, in the actuator portion 90, an electric field directed in an upward direction is generated in the first active portion 91 due to a potential difference between the drive electrode 51 and the high potential electrode 52. The upward direction in which the electric field is directed may be the same direction as a polarization direction of the first active portion 91. The first active portion 91 thus contracts in a surface direction (e.g., a direction along the X-axis direction and the Y-axis direction) of the piezoelectric layer 41. Accordingly, a portion of a lamination of the piezoelectric layers 41 to 43 and the ink separation layer 44 overlapping a pressure chamber 10 in the Z-axis direction is bent so as to be convex toward the pressure chamber 10 (e.g., downward). At that time, the pressure chamber 10 has a smaller volume than that when the lamination is in a flat state.

For ejecting ink from the head 3 through a particular nozzle 15 in response to the printer 1 starting a recording operation, first, potential for a drive electrode 51 corresponding to the nozzle 15 is changed from a low potential (e.g., the GND potential) to a high potential (e.g., a VDD potential). In response to this, the potential difference between the drive electrode 51 and the high potential electrode 52 disappears, and thus, as shown in FIG. 6B, the contraction of the first active portion 91 is eliminated. At that time, an electric field directed in a downward direction is generated in the second active portion 92 due to a potential difference between the drive electrode 51 and the low potential electrode 53. The downward direction in which the electric field is directed may be the same as a polarization direction of the second active portion 92. The second active portions 92 thus contract in a surface direction (e.g., a direction along the X-axis direction and the Y-axis direction) of the piezoelectric layer 41. Nevertheless, the second active portions 92 each reduce or prevent crosstalk (i.e., a phenomenon in which pressure fluctuation caused by deformation of the actuator portion 90 in a particular pressure chamber 10 is transmitted to another pressure chamber 10 adjacent to the particular pressure chamber 10 in the X-axis direction), and thus the contraction of the second active portions 92 is not likely to contribute to deformation of the actuator portion 90. That is, at this time, the lamination is in a flat state. In other words, the lamination might not be bent such that the portion overlapping the pressure chamber 10 in the Z-axis direction protrudes in a direction away from the pressure chamber 10 (e.g., upward). Thus, the pressure chamber 10 has a larger volume than the volume of the pressure chamber 10 in a state of FIG. 6A.

Thereafter, the potential for the drive electrode 51 corresponding to the nozzle 15 is changed from the high potential (e.g., the VDD potential) to the low potential (e.g., the GND potential). In response to this, the potential difference between the drive electrode 51 and the low potential electrode 53 disappears, and thus, as shown in FIG. 6A, the contraction of the second active portions 92 is eliminated. At that time, an electric field directed in the upward direction is generated in the first active portion 91 due to a potential difference between the drive electrode 51 and the high potential electrode 52. The upward direction in which the electric field is directed may be the same as the polarization direction of the first active portion 91. The first active portion 91 thus contracts in the surface direction of the piezoelectric layer 41. Accordingly, a portion the lamination overlapping the pressure chamber 10 in the Z-axis direction is bent so as to be convex toward the pressure chamber 10 (e.g., downward). At that time, the volume of the pressure chamber 10 is extremely reduced and thus a high pressure acts on ink in the pressure chamber 10, thereby causing ink ejection from the head 3 through the nozzle 15 that is in fluid communication with the pressure chamber 10.

The piezoelectric layer 41 corresponds to a first piezoelectric layer. Each high-potential terminal group 54 disposed on the upper surface of the piezoelectric layer 41 corresponds to a first electrode layer. The electrode portion 541 corresponds to a first electrode portion. The electrode portion 542 corresponds to a second electrode portion. The piezoelectric layer 42 disposed opposite to the high-potential terminal groups 54 with respect to the piezoelectric layer 41 in Z-axis direction corresponds to a second piezoelectric layer. The high potential electrode 52 disposed between the piezoelectric layer 41 and the piezoelectric layer 42 in the Z-axis direction corresponds to a second electrode layer. The elongated portion 5211 corresponds to a first elongated portion. The elongated portion 5212 corresponds to a second elongated portion. The elongated portion 5213 corresponds to a third elongated portion. The piezoelectric layer 43 disposed opposite to the high-potential terminal groups 54 with respect to the piezoelectric layer 42 in the Z-axis direction corresponds to a third piezoelectric layer. The connection electrode 58 disposed between the piezoelectric layer 42 and the piezoelectric layer 43 in the Z-axis direction corresponds to a third electrode layer. The COF 23 corresponds to an electric supply.

In the high potential electrode 52, as shown in FIG. 8, the trunk portion 521 further includes a plurality of junction points B from which the respective branch portions 523 are branched, and ends 521a spaced from the junction points B. The junction points B are included in the elongated portion 5211. The ends 521a are respectively included in the other end portion 5212b of the elongated portion 5212 and the other end portion 5213b of the elongated portion 5213.

The trunk portion 521 has a through hole 72 between the plurality of junction points B and each of the ends 521a. More specifically, for example, the trunk portion 521 has the through hole 72 at each of the elongated portions 5212 and 5213.

The elongated portion 5212 has a first region R1 and a second region R2. The first region R1 overlaps the elongated portion 5211 in the Y-axis direction. The second region R2 might not overlap the elongated portion 5211 in the Y-axis direction. The elongated portion 5213 has a third region R3 and a fourth region R4. The third region R3 overlaps the elongated portion 5211 in the Y-axis direction. The fourth region R4 might not overlap the elongated portion 5211 in the Y-axis direction. The through holes 72 are respectively defined in the second region R2 of the elongated portion 5212 and the fourth region R4 of the elongated portion 5213.

In the elongated portion 5212, the through hole 72 is offset toward an end of the elongated portion 5212 that is opposite to the end that is connected to the branch portion 523 that is closest to the seventh end 42c of the piezoelectric layer 42 in the Y-axis direction among the plurality of branch portions 523. That is, the through hole 72 is offset toward the left in FIG. 8. In the elongated portion 5213, the through hole 72 is offset toward an end of the elongated portion 5213 that is opposite to the end that is connected to the branch portion 523 that is closest to the eight end 42d of the piezoelectric layer 42 in the Y-axis direction among the plurality of branch portions 523. That is, the through hole 72 is offset toward the right in FIG. 8. More specifically, for example, each through hole 72 has the center 72X. In the elongated portion 5212, the through hole 72 is located such that the center 72x of the through hole 72 is positioned between a center line O and an end 5212e of the elongated portion 5212 in the X-axis direction. The end 5212e of the elongated portion 5212 is spaced from the elongated portion 5211 in the Y-axis direction. The center line O passes the center of the elongated portion 5212 and extends in the Y-axis direction. In a similar manner, in the elongated portion 5213, the through hole 72 is located such that the center 72x of the through hole 72 is positioned between a center line O and the end of the elongated portion 5213 in the X-axis direction. The center line O passes the center of the elongated portion 5213 and extends in the Y-axis direction. The end of the elongated portion 5213 is spaced from the elongated portion 5211 in the Y-axis direction.

The high potential electrode 52 having the through holes 72 is electrically connected to the high-potential terminal groups 54 via the through holes 71 of the piezoelectric layer 41 as described above. Each through hole 71 corresponds to a first through hole. Each through hole 72 corresponds to a second through hole.

Figure 10:
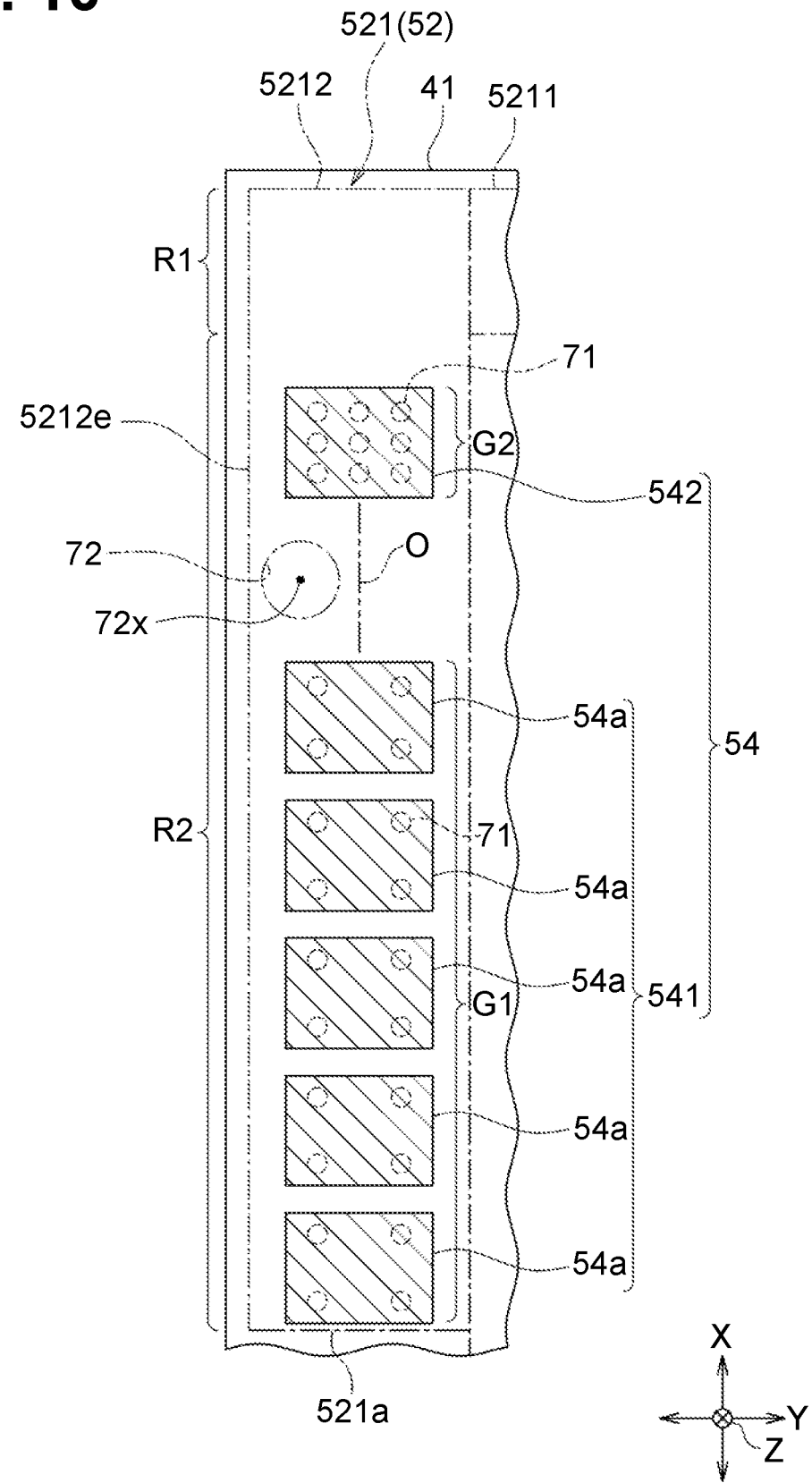
FIG. 10 is an enlarged view of a particular portion X of the piezoelectric actuator of FIG. 7 according to one or more illustrative embodiments of the disclosure.

As illustrated in FIG. 10, the through holes 71 are grouped into two groups such as a first group G1 and a second group G2. The first group G1 overlaps, in the Z-axis direction, a particular area of the trunk portion 521. The particular area is between the end 521a of the trunk portion 521 and the through hole 72 in the X-axis direction (e.g., the area where the electrode portion 541 of the high-potential terminal group 54 is provided). The second group G2 overlaps, in the Z-axis direction, a further particular area of the trunk portion 521. The further particular area is between the through hole 72 and the plurality of junction points B in the X-axis direction (e.g., the area where the electrode portion 542 of the high-potential terminal group 54 is provided).

The first group G1 includes the through holes 71 positioned below and overlapping the electrodes 54a of the electrode portion 541 of the high-potential terminal group 54 in the Z-axis direction. The second group G2 includes the through holes 71 positioned below and overlapping the electrode portion 542 of the high-potential terminal group 54 in the Z-axis direction. A density of the through holes 71 belonging to the second group G2 is higher than a density of the through holes 71 belonging to the first group G1.

As illustrated in FIG. 10, the through holes 71, the electrode portion 541, and the electrode portion 542 are positioned in the area of the piezoelectric layer 41 overlapping the second region R2 of the elongated portion 5212 in the Z-axis direction. The through holes 71, the electrode portion 541, and the electrode portion 542 are positioned in the area of the piezoelectric layer 41 overlapping the fourth region R4 (refer to FIG. 8) of the elongated portion 5213 in the Z-axis direction.

The high potential electrode 52 is electrically connected to the connection electrode 58 (refer to FIG. 9) via the through holes 73 (refer to FIG. 8) of the piezoelectric layer 42 as described above. Each through hole 73 corresponds to a third through hole.

As illustrated in FIG. 8, in each end portion of the piezoelectric layer 42 in the Y-axis direction, the through holes 73 are positioned in an area between the end 521a of the trunk portion 521 and the through hole 72 in the X-axis direction. The area where the through holes 73 are positioned overlaps, in the Z-axis direction, an area where the first group G1 is positioned (e.g., the area where the electrode portion 541 of the high-potential terminal group 54 is provided) but not overlap, in the Z-axis direction, the area where the second group G2 is positioned.

As described above, the high potential electrode 52 includes the trunk portion 521, and the branch portions 523 branched from the trunk portion 521 (refer to FIG. 8). The trunk portion 521 includes the junction points B from which the respective branch portions 523 are branched, and the ends 521a spaced from the junction points B. The trunk portion 521 has the through hole 72 between the plurality of junction points B and each of the ends 521a. As illustrated in FIG. 10, each of the through holes 71 that electrically connects between the high potential electrode 52 and a corresponding high-potential terminal group 54 belongs to the first group G1 or the second group G2. The first group G1 overlaps, in the Z-axis direction, the particular area of the trunk portion 521 between the end 521a of the trunk portion 521 and the through hole 72 in the X-axis direction. The second group G2 overlaps, in the Z-axis direction, the further particular area of the trunk portion 521 between the through hole 72 and the plurality of junction points B in the X-axis direction.

According to the illustrative embodiment, the high potential electrode 52 and the high-potential terminal groups 54 are electrically connected to each other via not only the through holes 71 belonging to the first group G1 but also the through holes 71 belonging to the second group G2. Even when the through holes 72 are defined in the high potential electrode 52, such a configuration may thus enable supply of electric charge to the high potential electrode 52 via the through holes 71 belonging to the second group G2, thereby reducing or preventing increase of electric resistance in the high potential electrode 52, eventually, for example, a problem in which deformation of the actuator portions 90 may be prevented due to insufficient supply of electric charge from the trunk portion 521 to the branch portions 523.

The density of the through holes 71 belonging to the second group G2 is higher than the density of the through holes 71 belonging to the first group G1 (refer to FIG. 10). Such a configuration may thus enable more effective supply of electric charge to the high potential electrode 52 via the second group G2, thereby further reducing or preventing increase of electric resistance in the high potential electrode 52.

The through holes 73 electrically connect between the high potential electrode 52 and the connection electrode 58. The through holes 73 are positioned in the area that overlaps, in the Z-axis direction, the area where the first group G1 is positioned but not overlap, in the Z-axis direction, the area where the second group G2 is positioned (refer to FIG. 8). In such a configuration, the through holes 73 are positioned below the through holes 71 belonging to the first group G1, and thus, the density of the through holes 71 belonging to the first group G1 may be hardly increased. On the other hand, the through holes 73 are not positioned below the through holes 71 belonging to the second group G2, and thus, the density of the through holes 71 belonging to the second group G2 may be readily increased. Such a configuration may thus effectively realize a configuration in which the density of the through holes 71 belonging to the second group G2 is larger than the density of the through holes 71 belonging to the first group G1.

As illustrated in FIG. 10, each high-potential terminal group 54 includes the electrode portion 541 for the first group G1 and the electrode portion 542 for the second group G2. The electrode portion 541 and the electrode portion 542 are spaced from each other. As compared with a case where each high-potential terminal group 54 includes an electrode portion extending between and overlapping both of the first group G1 and the second group G2, the configuration according to the illustrative embodiment may enable each electrode portion 541, 542 to have a smaller area and reduce or prevent each electrode portion 541, 542 from being warped or coming off.

As illustrated in FIG. 10, the electrode portion 542 has an area smaller than an area of the electrode portion 541. Such a configuration may enable the through holes 72 to be positioned adjacent to the respective first regions R1 (i.e., respective corner portions of the trunk portion 521). With this configuration, the through holes 72 are detected and used in positioning of the piezoelectric actuator 22, thereby enabling accurate positioning of the piezoelectric actuator 22 relative to the channel unit 21 with reference to the detected through holes 72.

As illustrated in FIG. 8, the elongated portion 5212 has the through hole 72 in the second region R2. The first region R1 of the elongated portion 5212 corresponds to one of the corner portions of the trunk portion 521 that is likely to be warped. If the through hole 72 is positioned in the first region R1 and the piezoelectric actuator 22 is positioned relative to the channel unit 21 with reference to the detected through hole 72, warping occurring in the first region R1 may cause loss of the detection accuracy of the through hole 72, thereby causing inaccurate positioning of the piezoelectric actuator 22 relative to the channel unit 21. In this regard, according to the illustrative embodiment, the through hole 72 is positioned not in the first region R1 but in the second region R2. Such a configuration may thus reduce occurrence of such a problem.

As illustrated in FIG. 8, the through hole 72 is positioned at the second region R2 in each of the elongated portions 5212 and 5213 that are spaced from each other in the Y-axis direction. With this configuration, the through holes 72 are detected and used in positioning of the piezoelectric actuator 22, thereby enabling accurate positioning of the piezoelectric actuator 22 relative to the channel unit 21 with reference to the detected through holes 72.

As illustrated in FIG. 10, in the elongated portion 5212, the through hole 72 is located such that the center 72x of the through hole 72 is positioned between the center line O and the end 5212e of the elongated portion 5212 in the X-axis direction. In the elongated portion 5213, the through hole 72 is located such that the center 72x of the through hole 72 is positioned between the center line O and the end of the elongated portion 5213 in the X-axis direction. The end 5212e of the elongated portion 5212 and the end of the elongated portion 5213 are spaced from the elongated portion 5211 in the Y-axis direction. Such a configuration may enable the distance between the through holes 72 in the Y-axis direction to be increased (refer to FIG. 8), thereby enabling accurate positioning of the piezoelectric actuator 22 relative to the channel unit 21 with reference to the detected through holes 72.

Modifications

While the disclosure has been described in detail with reference to the specific embodiment thereof, this is merely an example, and various changes, arrangements and modifications may be applied therein without departing from the spirit and scope of the disclosure.

In the illustrative embodiment, the first, second, and third through holes each have a circular shape when viewed in the first direction (e.g., the Z-axis direction). Nevertheless, in other embodiments, for example, the first, second, and third through holes may each have any other shape, for example, a rectangular shape.

The position where the second through hole is defined is not limited to the second region R2 (refer to FIG. 8) of the elongated portion 5212, 5213. In other embodiments, for example, the second through hole may be defined in the first region R1. The center of the second through hole may coincide with the center line that extends in the second direction and passes the center of the elongated portion 5212, 5213. Both of the elongated portions 5212 and 5213 (refer to FIG. 8) might not necessarily have the through hole 72.

A mark (e.g., a mark made of the same material as the second electrode layer) may be provided inside the second through hole, and the mark may be detected and used as a positioning mark.

The third through holes may be defined in an area that may overlap, in the first direction, the area where the second group is provided. The piezoelectric actuator might not necessarily include the third electrode layer.

The density of the first through holes belonging to the second group may be lower than or equal to the density of the first through holes belonging to the first group.

The second electrode portion may have an area larger than or equal to the area of the first electrode portion.

Each first electrode layer may have an electrode portion extending over both of the first group and the second group instead of two electrode portions that may be provided for the first group and the second group, respectively, and separated from each other.

In the illustrative embodiment, the piezoelectric layer 42 that may be a middle layer of the piezoelectric layers 41, 42, and 43 corresponds to the second piezoelectric layer. The high potential electrode 52 disposed on the surface of the piezoelectric layer 42 corresponds to the second electrode layer. Nevertheless, in other embodiments, for example, the piezoelectric layer 43 that may be a lowest layer of the piezoelectric layers 41, 42, and 43 may correspond to the second piezoelectric layer. In this case, the low potential electrode 53 disposed on the surface of the piezoelectric layer 43 may correspond to the second electrode layer. The low potential electrode 53 may have the through holes 72. The piezoelectric layer 42 may correspond to the first piezoelectric layer, and each of the connection electrode groups 56 may correspond to the first electrode layer.

In the illustrative embodiment, the piezoelectric actuator includes three piezoelectric layers. Nevertheless, in other embodiments, for example, the piezoelectric actuator may include less or more piezoelectric layers.

The disclosure may be applied to not only a printer but also a facsimile machine, a copying machine, or a multifunction device. Further, the disclosure may be applied to other liquid ejection devices used for purposes other than image recording. For example, the disclosure may be applied to a liquid ejection device configured to form conductive patterns on a surface of a substrate by ejecting conductive liquid onto the substrate. The piezoelectric actuator according to the disclosure may be applied to another apparatus or device other than a liquid ejection apparatus.

What is claimed is:

1. A piezoelectric actuator comprising:
   a first piezoelectric layer having a plurality of first through holes;
   a first electrode layer disposed on one surface of the first piezoelectric layer, the first electrode layer connected to a power supply;
   a second piezoelectric layer disposed opposite to the first electrode layer with respect to the first piezoelectric layer in a first direction orthogonal to the surface of the first piezoelectric layer; and
   a second electrode layer disposed between the first piezoelectric layer and the second piezoelectric layer in the first direction,
   wherein the first electrode layer and the second electrode layer are electrically connected to each other via the plurality of first through holes of the first piezoelectric layer,
   wherein the second electrode layer includes a trunk portion and a plurality of branch portions branched from the trunk portion,
   wherein the trunk portion includes:
      a plurality of junction points from each of which a corresponding branch portion of the plurality of branch portions are branched;
      an end spaced from the plurality of junction points; and
      a second through hole positioned between the plurality of junction points and the end of the trunk portion,
   wherein the plurality of first through holes are grouped into a first group and a second group, and
   wherein the first group overlaps, in the first direction, a particular area defined between the end of the trunk portion and the second through hole and the second group overlaps, in the first direction, another particular area defined between the second through hole and the plurality of junction points.

2. The piezoelectric actuator according to claim 1,
   wherein a density of the first through holes belonging to the second group is higher than a density of the first through holes belonging to the first group.

3. The piezoelectric actuator according to claim 2, further comprising:
   a third piezoelectric layer disposed opposite to the first electrode layer with respect to the second piezoelectric layer in the first direction; and
   a third electrode layer disposed between the second piezoelectric layer and the third piezoelectric layer in the first direction,
   wherein the second piezoelectric layer has a plurality of third through holes,
   wherein the second electrode layer and the third electrode layer are electrically connected to each other via the plurality of third through holes of the second piezoelectric layer, and
   wherein, in the second piezoelectric layer, the plurality of third through holes are positioned in an area that overlaps, in the first direction, an area where the first group is positioned and not overlap, in the first direction, an area where the second group is positioned.

4. The piezoelectric actuator according to claim 1,
   wherein the first electrode layer includes:
      a first electrode portion overlapping, in the first direction, an area where the first group is positioned; and
      a second electrode portion overlapping, in the first direction, an area where the second group is positioned, and
   wherein the first electrode portion and the second electrode portion are spaced from each other.

5. The piezoelectric actuator according to claim 4,
   wherein the second electrode portion has an area smaller than an area of the first electrode portion.

6. The piezoelectric actuator according to claim 1,
   wherein the trunk portion includes:
      a first elongated portion from which the plurality of branch portions are branched and that extends in a second direction orthogonal to the first direction;
      a second elongated portion that is connected to one end of the first elongated portion in the second direction and extends in a third direction orthogonal to the first direction and intersecting the second direction,
   wherein the second elongated portion includes:
      a first region overlapping the first elongated portion in the second direction; and
      a second region not overlapping the first elongated portion in the second direction, and
   wherein the second through hole is positioned in the second region.

7. The piezoelectric actuator according to claim 6,
   wherein the trunk portion further includes:
      a further second through hole; and
      a third elongated portion that is connected to the other end of the first elongated portion in the second direction and extends in the third direction,
   wherein the third elongated portion includes:
      a third region overlapping the first elongated portion in the second direction; and
      a fourth region not overlapping the first elongated portion in the second direction, and wherein the further second through hole is positioned in the fourth region.

8. The piezoelectric actuator according to claim 7, wherein, in the second elongated portion, the second through hole is located such that a center of the second through hole is positioned between a center line and an end of the second elongated portion in the second direction, and the center line passes a center of the second elongated portion and extends in the second direction, and wherein, in the third elongated portion, the further second through hole is located such that a center of the further second through hole is positioned between a center line and an end of the third elongated portion in the second direction, and the center line passes a center of the third elongated portion and extends in the second direction.

\* \* \* \* \*